(12) United States Patent
Cheng et al.

(10) Patent No.: US 12,266,607 B2
(45) Date of Patent: Apr. 1, 2025

(54) BOTTOM BARRIER FREE INTERCONNECTS WITHOUT VOIDS

(71) Applicant: International Business Machines Corporation, Armonk, NY (US)

(72) Inventors: Kenneth Chun Kuen Cheng, Shatin (HK); Koichi Motoyama, Clifton Park, NY (US); Kisik Choi, Watervliet, NY (US); Cornelius Brown Peethala, Slingerlands, NY (US); Hosadurga Shobha, Niskayuna, NY (US); Joe Lee, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 487 days.

(21) Appl. No.: 17/493,486

(22) Filed: Oct. 4, 2021

(65) Prior Publication Data
US 2022/0028797 A1    Jan. 27, 2022

Related U.S. Application Data

(62) Division of application No. 16/586,947, filed on Sep. 28, 2019, now Pat. No. 11,164,815.

(51) Int. Cl.
*H01L 23/532* (2006.01)
*H01L 21/02* (2006.01)
(Continued)

(52) U.S. Cl.
CPC .. *H01L 23/53266* (2013.01); *H01L 21/02183* (2013.01); *H01L 21/0228* (2013.01);
(Continued)

(58) Field of Classification Search
CPC ........ H01L 23/53266; H01L 21/02183; H01L 21/0228; H01L 21/76807; H01L 21/76831; H01L 21/76849; H01L 21/76877; H01L 23/5226; H01L 23/5283; H01L 21/28562; H01L 21/76885; H01L 21/76844
See application file for complete search history.

(56) References Cited

U.S. PATENT DOCUMENTS 5,545,927 A * 8/1996 Farooq ............. H01L 23/53228
257/E23.06
6,468,894 B1 * 10/2002 Yang ................. H01L 21/76819
438/678
(Continued)

OTHER PUBLICATIONS

Yang et al., "Selective Chemical Vapor Deposition-Grown Ru for Cu Interconnect Capping Applications," Electrochemical and Solid-State Letters, 13(5) D33-D35 (Mar. 2010).
(Continued)

*Primary Examiner* — Galina G Yushina
(74) *Attorney, Agent, or Firm* — Edward J. Wixted, III

(57) ABSTRACT

Bottom barrier free interconnects are provided. In one aspect, an interconnect structure includes: metal lines embedded in a dielectric; an interlayer dielectric (ILD) disposed over the metal lines; interconnects formed in the ILD on top of the metal lines; a barrier layer separating the interconnects from the ILD, wherein the barrier layer is absent in between the interconnects and the metal lines; and a selective capping layer disposed on the interconnects.

18 Claims, 7 Drawing Sheets

(51) Int. Cl.
*H01L 21/768* (2006.01)
*H01L 23/522* (2006.01)
*H01L 23/528* (2006.01)

(52) U.S. Cl.
CPC .. *H01L 21/76807* (2013.01); *H01L 21/76816* (2013.01); *H01L 21/76831* (2013.01); *H01L 21/76849* (2013.01); *H01L 21/76877* (2013.01); *H01L 23/5226* (2013.01); *H01L 23/5283* (2013.01)

(56) References Cited

U.S. PATENT DOCUMENTS

| | | | |
|---|---|---|---|
| 6,852,635 B2 * | 2/2005 | Satta | H01L 23/53252 |
| | | | 257/E21.171 |
| 6,930,034 B2 | 8/2005 | Colburn et al. | |
| 7,023,093 B2 | 4/2006 | Canaperi et al. | |
| 7,338,893 B2 | 3/2008 | Engbrecht et al. | |
| 7,982,312 B2 | 7/2011 | Colburn et al. | |
| 8,124,522 B1 | 2/2012 | Wu et al. | |
| 9,330,989 B2 | 5/2016 | Wu et al. | |
| 9,343,294 B2 | 5/2016 | Chi et al. | |
| 9,502,303 B2 | 11/2016 | Li et al. | |
| 9,716,063 B1 | 7/2017 | Edelstein et al. | |
| 9,748,169 B1 | 8/2017 | Murray et al. | |
| 9,953,865 B1 | 4/2018 | Briggs et al. | |
| 9,985,023 B1 | 5/2018 | Liu et al. | |
| 10,177,028 B1 | 1/2019 | LiCausi et al. | |
| 10,204,829 B1 | 2/2019 | Amanapu et al. | |
| 10,224,242 B1 | 3/2019 | Yang et al. | |
| 10,566,246 B1 | 2/2020 | Wu et al. | |
| 10,700,064 B1 | 6/2020 | Zhang et al. | |
| 10,748,812 B1 | 8/2020 | Cheng et al. | |
| 10,879,107 B2 | 12/2020 | Dutta et al. | |
| 2005/0121788 A1 * | 6/2005 | Watanabe | H01L 21/7684 |
| | | | 257/E23.152 |
| 2005/0179213 A1 * | 8/2005 | Huang | H01L 23/564 |
| | | | 277/620 |
| 2005/0184397 A1 * | 8/2005 | Gates | H01L 23/5222 |
| | | | 257/774 |
| 2005/0191855 A1 | 9/2005 | Chen et al. | |
| 2006/0024953 A1 | 2/2006 | Papa Rao et al. | |
| 2006/0178002 A1 | 8/2006 | Kim et al. | |
| 2006/0194430 A1 * | 8/2006 | Beck | H01L 21/76838 |
| | | | 257/E21.582 |
| 2007/0080461 A1 * | 4/2007 | Lu | H01L 21/76807 |
| | | | 257/E21.579 |
| 2009/0218699 A1 * | 9/2009 | Torres | H01L 21/76814 |
| | | | 257/E21.585 |
| 2010/0006850 A1 | 1/2010 | Tyberg et al. | |
| 2010/0308463 A1 * | 12/2010 | Yu | H01L 21/02074 |
| | | | 257/E23.141 |
| 2011/0074039 A1 | 3/2011 | Zhang et al. | |
| 2011/0304053 A1 | 12/2011 | Lin et al. | |
| 2012/0223439 A1 * | 9/2012 | Blatchford | H01L 21/76895 |
| | | | 257/E21.585 |
| 2013/0323930 A1 | 12/2013 | Chattopadhyay et al. | |
| 2014/0021612 A1 | 1/2014 | Huang et al. | |
| 2014/0027908 A1 | 1/2014 | Tsai et al. | |
| 2015/0061141 A1 * | 3/2015 | Tung | H01L 21/76852 |
| | | | 257/773 |
| 2016/0079161 A1 * | 3/2016 | Lin | H01L 21/321 |
| | | | 438/666 |
| 2016/0118296 A1 | 4/2016 | Kolics et al. | |
| 2016/0141250 A1 * | 5/2016 | Bao | H01L 21/7684 |
| | | | 257/751 |
| 2017/0220794 A1 | 8/2017 | Beatson et al. | |
| 2017/0256488 A1 * | 9/2017 | Lee | H01L 23/53238 |
| 2018/0033723 A1 | 2/2018 | Landgraf et al. | |
| 2018/0240971 A1 | 8/2018 | Briggs et al. | |
| 2019/0006230 A1 | 1/2019 | Kuo et al. | |
| 2019/0088540 A1 | 3/2019 | Hou et al. | |
| 2019/0122982 A1 | 4/2019 | Hourani et al. | |
| 2019/0139887 A1 | 5/2019 | Lin et al. | |
| 2019/0181033 A1 | 6/2019 | Penny et al. | |
| 2019/0189508 A1 | 6/2019 | Peethala et al. | |
| 2019/0198444 A1 | 6/2019 | Amanapu et al. | |
| 2020/0075720 A1 | 3/2020 | Cheng et al. | |
| 2020/0098922 A1 | 3/2020 | You et al. | |
| 2020/0111736 A1 | 4/2020 | Amanapu et al. | |
| 2020/0279933 A1 | 9/2020 | Cheng et al. | |
| 2020/0312764 A1 | 10/2020 | Ning et al. | |
| 2020/0343131 A1 | 10/2020 | Choi et al. | |
| 2020/0381306 A1 | 12/2020 | Park et al. | |
| 2021/0057333 A1 * | 2/2021 | Tsai | H01L 21/76843 |
| 2021/0098388 A1 | 4/2021 | Cheng et al. | |

OTHER PUBLICATIONS

K. Motoyama et al., "Discrete Study of ALD TaN on Via and Line for Low Resistive and High Reliable Cu/Low-k Interconnects and Other Applications," ECS journal of Solid State Science and Technology, 1(6) p. 303-p. 309 (Oct. 2012).

List of IBM Patents or Applications Treated as Related, Oct. 4, 2021 (2 pages).

* cited by examiner

A-A'

B-B'

BOTTOM BARRIER FREE INTERCONNECTS WITHOUT VOIDS

FIELD OF THE INVENTION

The present invention relates to interconnect technology, and more particularly, to techniques to enable bottom barrier free (e.g., cobalt (Co)) interconnects without voids.

BACKGROUND OF THE INVENTION

During semiconductor device fabrication, a dual damascene process is often employed to form interconnects. With a dual damascene process, features such as trenches over vias are first patterned in a dielectric. The features are then filled with a conductor(s) to form the interconnects. When the trenches are formed before the vias, the process is also referred to as a "trench-first" process. Conversely, when the vias are formed before the trenches, the process is also referred to as a "via-first" process.

Conventional interconnects employ metals such as copper (Cu) as the conductor. Namely, metallization typically involves first lining the features with a barrier layer, and then depositing Cu into the features over the barrier layer. However, for dual damascene Cu interconnects beyond 18 nanometers (nm) critical dimension (CD), a void-free feature fill using Cu is challenging. The presence of voids undesirably leads to a decrease in conductor area and thus a higher interconnect resistance. Further, fully lining the features with a barrier layer places the barrier layer at the bottom of the vias. Having the barrier layer at the via bottom undesirably leads to high via resistance.

Damage to the dielectric can also occur during patterning of the features in the dielectric, and plasma damage to the dielectric can occur during metallization. Such dielectric damage is undesirable as it leads to a high capacitance, especially with reduced scale interconnects.

Via chamfering and via bowing can also occur during patterning of the features in the dielectric. Chamfering refers to a widening or beveling of the top profile of the via, while via bowing refers to widening of the via CD that causes the via side wall to form a bow shape. Chamfering is undesirable as it degrades Cu fill and reliability.

Therefore, improved techniques for forming interconnects would be desirable.

SUMMARY OF THE INVENTION

The present invention provides techniques to enable bottom barrier free (e.g., cobalt (Co)) interconnects without voids. In one aspect of the invention, an interconnect structure is provided. The interconnect structure includes: metal lines embedded in a dielectric; an interlayer dielectric (ILD) disposed over the metal lines; interconnects formed in the ILD on top of the metal lines; a barrier layer separating the interconnects from the ILD, wherein the barrier layer is absent in between the interconnects and the metal lines; and a selective capping layer disposed on the interconnects.

A more complete understanding of the present invention, as well as further features and advantages of the present invention, will be obtained by reference to the following detailed description and drawings.

DETAILED DESCRIPTION OF PREFERRED EMBODIMENTS

Figure 1A:
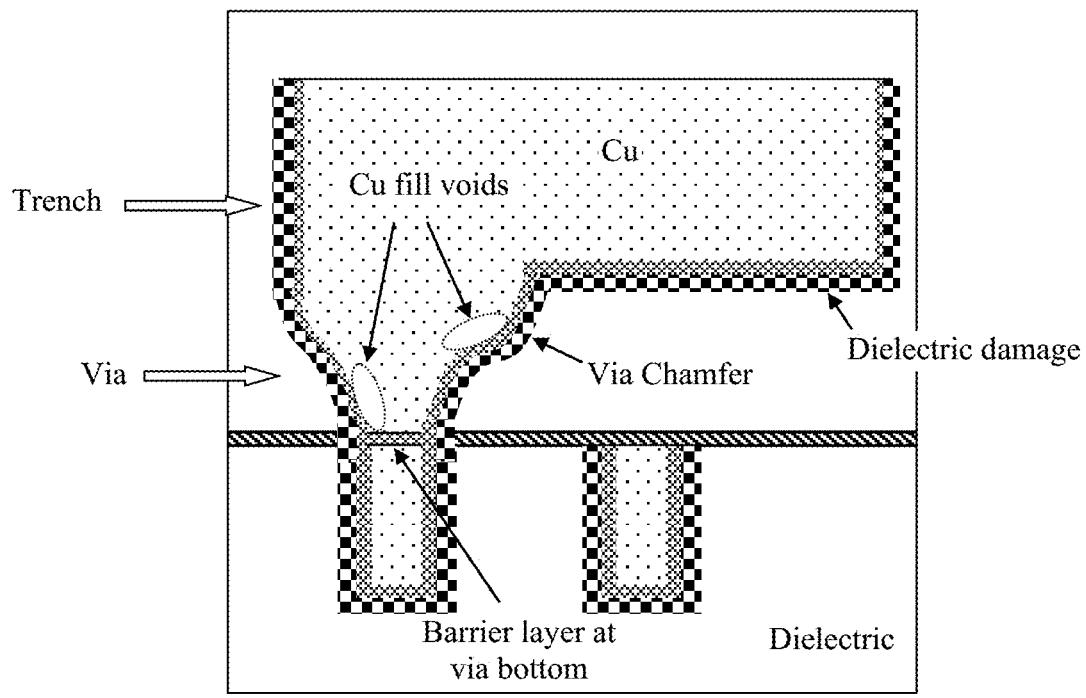
FIG. 1A is a cross-sectional diagram illustrating a conventional dual damascene copper (Cu) interconnect structure having Cu fill voids, dielectric damage, and chamfering.
Figure 1B:
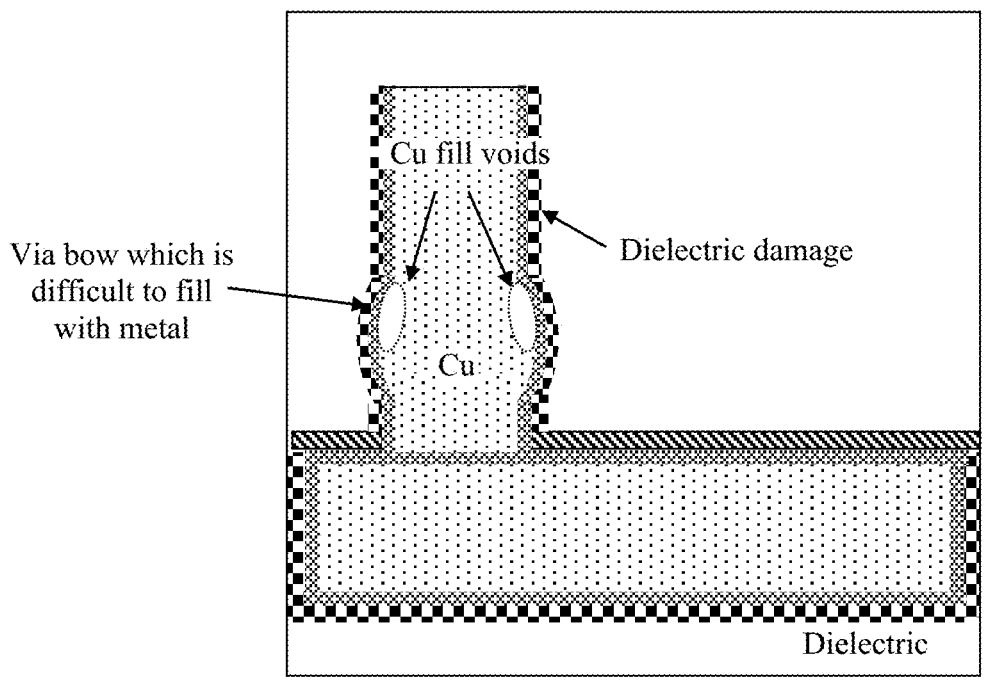
FIG. 1B is a cross-sectional diagram illustrating a conventional dual damascene Cu interconnect structure having Cu fill voids, dielectric damage, and bowing.

As provided above, the use of conventional copper (Cu)-based interconnect designs has some notable drawbacks, especially for dual damascene Cu interconnects beyond 18 nanometers (nm) critical dimension (CD). For instance, it is difficult to achieve a void-free feature fill using Cu. See, e.g., FIGS. 1A-C which illustrate a conventional dual damascene Cu interconnect structure. An electroplating process is typically employed to deposit Cu into the interconnect features. However, as shown in FIG. 1A and FIG. 1B, when the features are small this process often results in the formation of Cu fill voids, i.e., areas of the interconnect not containing the Cu conductor. The presence of these voids undesirably leads to an increase in the interconnect resistance.

Conventional processes also typically involve the placement of a barrier layer that fully lines the features (e.g., trench and via) including at the bottom of the via. Having the barrier layer at the via bottom further contributes to a higher resistance.

Figure 1C:
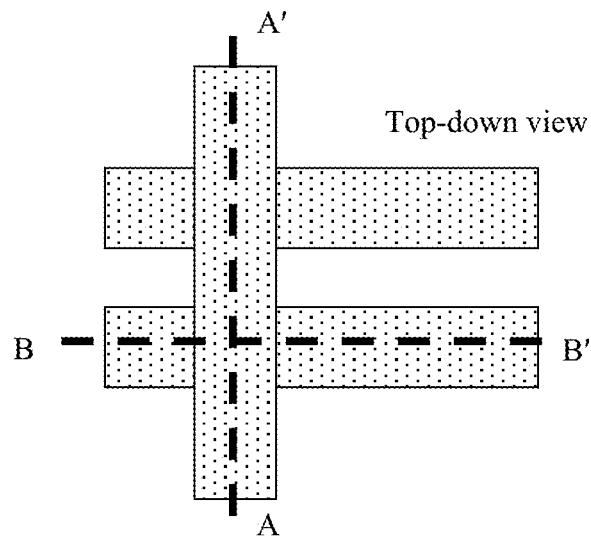
FIG. 1C is a top-down diagram illustrating an orientation of the cross-sectional views shown in FIG. 1A and FIG. 1B.

As also provided above, damage to the surrounding dielectric can occur during both the patterning and metallization phases of the interconnect formation process. See FIG. 1A which shows dielectric damage along the perimeter of each of the features. Dielectric damage undesirably leads to a higher capacitance. The increased capacitance is a concern especially with interconnects at a reduced scale. As also illustrated in FIG. 1A and FIG. 1B, via chamfering and bowing can undesirably occur during the patterning phase whereby the top of the via is widened. Chamfering can occur, for example, during the patterning of the trench over the via. Via chamfering and bowing degrades Cu fill and reliability. Chamfering and bowing can also lead to unwanted shorting between adjacent vias. FIG. 1C, a top-down view, illustrates an orientation of the cross-sectional cuts shown in FIG. 1A (A-A') and FIG. 1B (B-B').

Figure 2:
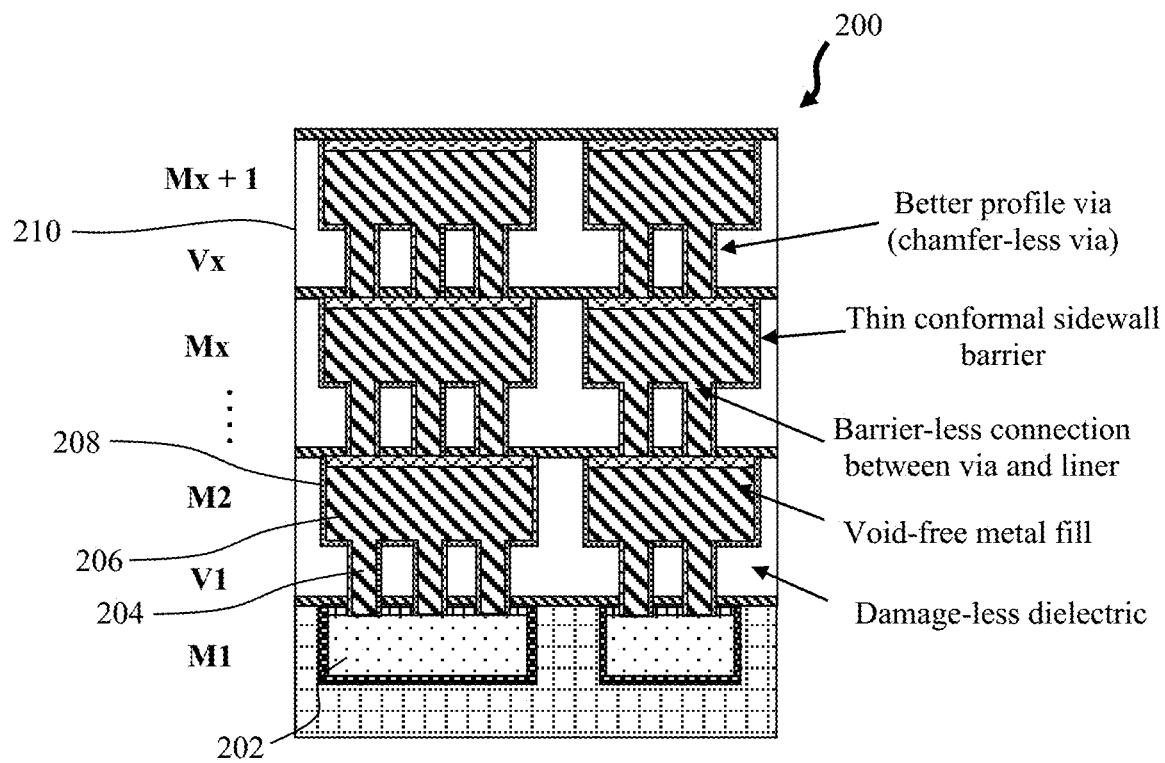
FIG. 2 is a cross-sectional diagram illustrating an interconnect structure according to an embodiment of the present invention.

Advantageously, provided herein are techniques for forming interconnects that address each of these drawbacks. See, for example, FIG. 2 which illustrates an interconnect structure 200 formed using the present techniques. As shown in FIG. 2, interconnect structure 200 is formed over a metal line M1 containing, e.g., Cu, lines 202. Each level of the interconnect structure 200 includes at least one via 204 (i.e., V1, . . . , Vx), and at least one metal line 206 (i.e., M2, . . . , Mx+1) over the vias 204. According to an exemplary embodiment, the metal lines 206 are formed from an alternate conductor such as cobalt (Co) and/or ruthenium (Ru). The use of Co and/or Ru (as opposed to traditional conductors such as Cu) enables a void-free feature fill via processes such as chemical vapor deposition (CVD) and/or physical vapor deposition (PVD) and reflow.

A thin, conformal barrier layer 208 (e.g., tantalum nitride (TaN)) lines the sidewalls of vias 204 and metal lines 206. However, barrier layer 208 is absent from the via bottoms thus creating a barrier-less connection between the vias 204 and the metal lines 206.

Each level of the interconnect structure 200 is formed in an interlayer (ILD) dielectric 210. Advantageously, the present techniques involve use of sacrificial dielectric for patterning and metallization, which is then removed (hence the term "sacrificial") and replaced with a 'replacement' dielectric such as a low-κ or ultra low-κ dielectric (ULK-ILD). Thus, any damage caused by the patterning and metallization is removed along with the sacrificial dielectric. Further, this sacrificial/replacement dielectric process enables the use of a more robust sacrificial dielectric material such as silicon dioxide ($SiO_2$) and/or silicon nitride (SiN) for the patterning and metallization, leading to minimal, if any, via chamfer and thus an improved via profile.

Figure 3:
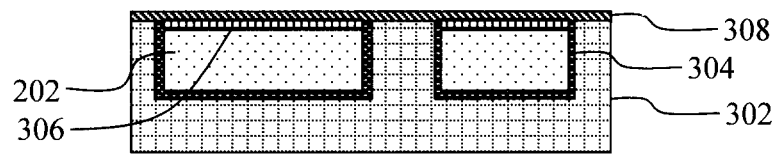
FIG. 3 is a cross-sectional diagram illustrating at least one metal line embedded in a dielectric, a conformal barrier layer separating the metal lines from the dielectric, a selective capping layer disposed on the metal lines, and a blanket capping layer disposed over the metal lines/selective capping layer and dielectric according to an embodiment of the present invention.

An exemplary methodology for forming interconnect structure 200 in accordance with the present techniques is now described by way of reference to FIGS. 3-14. Like structures are numbered alike in the figures. As shown in FIG. 3, the process begins with at least one metal line 202 embedded in a dielectric 302. Suitable dielectrics 302 include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). According to an exemplary embodiment, metal lines 202 are formed from Cu. Other suitable materials for metal lines 202 include, but are not limited to, Co, Ru, rhodium (Rh) and/or iridium (Ir).

As shown in FIG. 3, metal lines 202 are separated from dielectric 302 by a conformal barrier layer 304. According to an exemplary embodiment, barrier layer 304 is formed from TaN. A selective capping layer 306 is disposed (selectively) on the metal lines 202. Suitable materials for selective capping layer 306 include, but are not limited to, Ru, Co, tungsten (W), nickel (Ni) and combinations thereof such as cobalt-tungsten phosphide (CoWP). According to an exemplary embodiment, selective capping layer 306 is formed from Ru and is deposited on the metal lines 202 using a process such as selective CVD with a Ru-containing precursor such as Triruthenium dodecacarbonyl ($Ru_3(CO)_{12}$) which will deposit Ru on the surface of metal lines 202 selective to the surface of dielectric 302. A blanket capping layer 308 is disposed over the metal lines 202/selective capping layer 306 and dielectric 302. See FIG. 3. Suitable materials for blanket capping layer 308 include, but are not limited to, nitride materials such as silicon nitride (SiN), silicon carbonitride (SiCN) and/or silicon oxycarbonitride (SiOCN).

A sacrificial dielectric 402 is then deposited onto dielectric 302 over the metal lines 202. See FIG. 4. Suitable sacrificial dielectric 402 materials include, but are not limited to, $SiO_2$ and/or SiN. As provided above, dielectrics such as $SiO_2$ and SiN are more robust than the low-κ or ultra low-κ dielectric desired in the final end product. Thus, the sacrificial dielectric 402 will hold up better during the patterning and metallization process, producing a better via profile with little, if any, chamfering.

Figure 4:
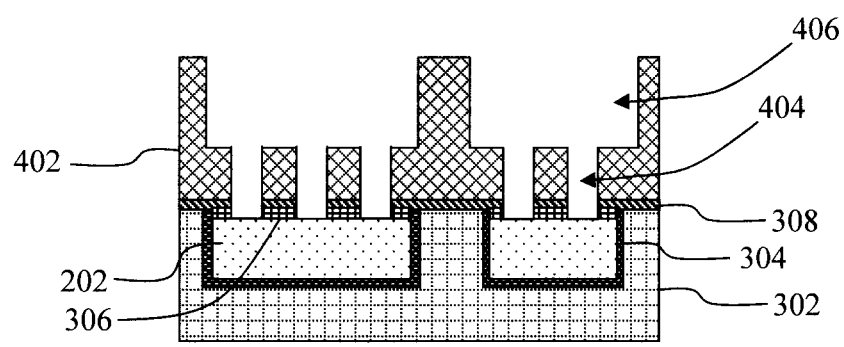
FIG. 4 is a cross-sectional diagram illustrating a sacrificial dielectric having been deposited onto the dielectric over the metal lines, and vias and trenches having been patterned in the sacrificial dielectric down to the metal lines with the trenches positioned over the vias according to an embodiment of the present invention.
Figure 5:
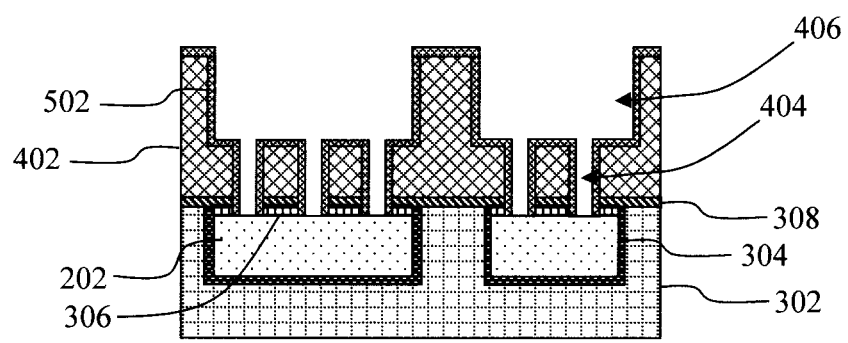
FIG. 5 is a cross-sectional diagram illustrating a conformal barrier layer having been selectively deposited onto the sacrificial dielectric, lining the vias and trenches, but absent from a bottom of the vias according to an embodiment of the present invention.
Figure 6:
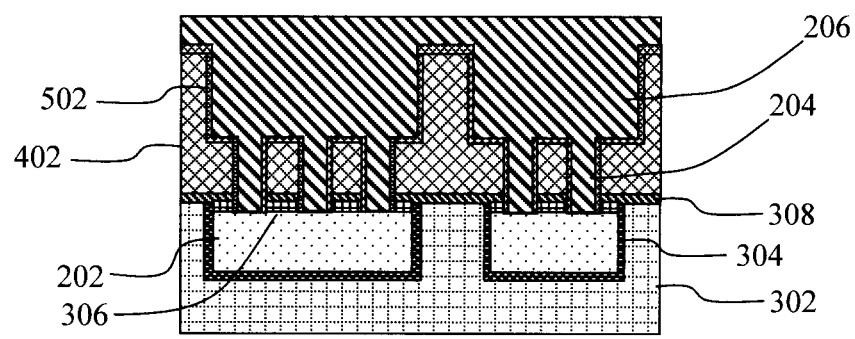
FIG. 6 is a cross-sectional diagram illustrating a conductor having been deposited into and filling the vias and trenches over the barrier layer to form conductive vias and metal lines according to an embodiment of the present invention.

Namely, as shown in FIG. 4 standard lithography and etching techniques are next used to pattern features, i.e., vias 404 and trenches 406, in sacrificial dielectric 402 on top of/down to the metal lines 202 with the trenches 406 positioned over the vias 404. As highlighted above, when trenches 406 are patterned before the vias 404, the process is referred to herein as a "trench-first" process, and when the vias 404 are patterned before the trenches 406, the process is referred to herein as a "via-first" process. Either a trench-first or a via-first process can be implemented in accordance with the present techniques. As shown in FIG. 4, vias 404 extend through both selective capping layer 306 and blanket capping layer 308, down to metal lines 202.

A conformal barrier layer 502 is then selectively deposited onto sacrificial dielectric 402, lining vias 404 and trenches 406. See FIG. 5. By 'selectively deposited' it is meant that by this process barrier layer 502 is deposited on only the exposed dielectric surfaces within vias 404 and trenches 406 such as on sacrificial dielectric 402 and blanket capping layer 308, and not on metal surfaces such as on metal lines 202 at a bottom of the vias 404. As a result, barrier layer 502 is absent from the bottoms of vias 404, thus permitting a barrier-less connection between the vias 204 and the metal lines 202.

Suitable barrier layer 502 materials include, but are not limited to, TaN. By way of example only, selective deposition of materials such as TaN on dielectric as opposed to metal surfaces can be accomplished using a process such as atomic layer deposition (ALD). For instance, ALD TaN growth occurs first on dielectric surfaces, while there is an incubation time for ALD TaN growth on metal surfaces. For instance, a TaN layer of up to about 1 nm thick will grow on dielectric surfaces prior to any growth occurring on metal surfaces. See, e.g., K. Motoyama et al., "Discrete Study of ALD TaN on Via and Line for Low Resistive and High Reliable Cu/Low-k Interconnects and Other Applications, ECS journal of Solid State Science and Technology, 1(6) P303-P309 (October 2012), the contents of which are incorporated by reference as if fully set forth herein. Thus, if kept thin enough, ALD TaN growth can be limited to the dielectric surfaces such as on sacrificial dielectric 402 and etch stop layer 308, selective to metal lines 202 (where TaN is absent). As such, according to an exemplary embodiment, barrier layer 502 is deposited to a thickness of less than or equal to about 1 nm, e.g., from about 0.5 nm to about 1 nm, and ranges therebetween.

Next, a conductor is deposited into and filling vias 404 and trenches 406 over barrier layer 502 to form conductive vias 204 and the metal lines 206, respectively. See FIG. 6. As provided above, suitable conductors include, but are not limited to, Co and/or Ru. Other suitable conductors include, but are not limited to, Cu, Rh and/or Ir. According to an exemplary embodiment, the conductor is deposited into vias 404 and trenches 406 using a process such as CVD and/or PVD followed by reflow. Advantageously, as provided above, the deposition of Co and/or Ru (as opposed to traditional conductors such as Cu) in this manner enables a void-free feature fill (note that there is an absence of voids in FIG. 6).

Figure 7:
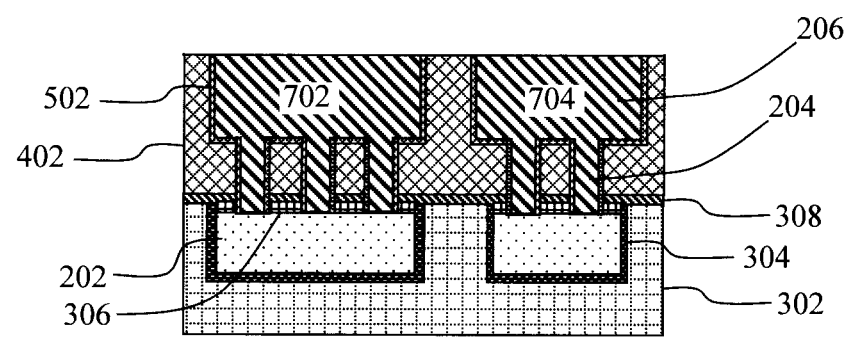
FIG. 7 is a cross-sectional diagram illustrating excess conductor having been removed (e.g., by chemical-mechanical polishing (CMP)) whereby the conductive vias and metal lines together form interconnects according to an embodiment of the present invention.
Figure 8:
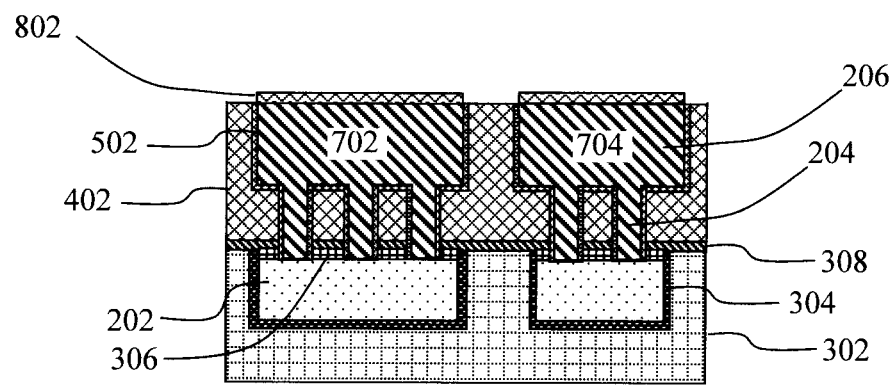
FIG. 8 is a cross-sectional diagram illustrating a selective capping layer having been formed on each of the interconnects according to an embodiment of the present invention.

Excess conductor is then removed using a process such as chemical-mechanical polishing (CMP) to polish the conductor down to the surface of sacrificial dielectric 402. See FIG. 7. As shown in FIG. 7, the result is a flat, planar surface. Conductive vias 204 and the metal lines 206 together form interconnects 702 and 704. See FIG. 7. It is notable that, e.g., based on the above-described process for selective deposition of barrier layer 502, there is no barrier at the bottom of the vias 204 in between the interconnects 702/704 and the metal lines 202.

A selective capping layer 802 is then (selectively) formed on/capping each of the interconnects 702 and 704. See FIG. 8. Suitable metals for selective capping layer 802 include, but are not limited to, Ru, Co, W, Ni and combinations thereof such as CoWP. According to an exemplary embodiment, capping layer 802 is formed from Ru and is deposited on the metal lines 206 using a process such as selective CVD with a Ru-containing precursor such as $Ru_3(CO)_{12}$ which will deposit Ru on the surface of metal lines 206 selective to the surface of sacrificial dielectric 402.

Figure 9:
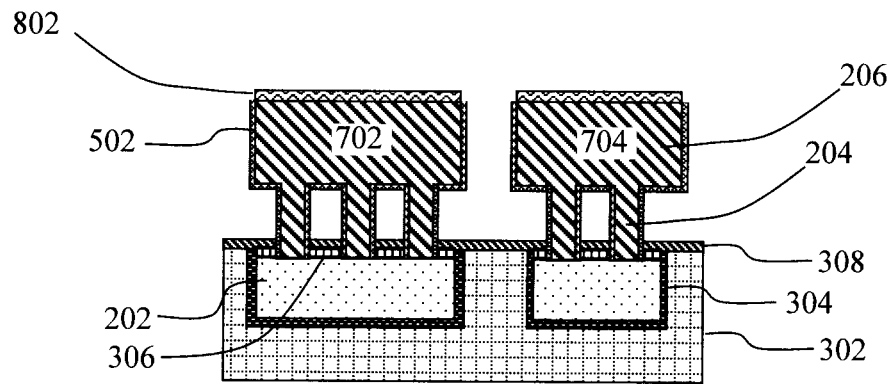
FIG. 9 is a cross-sectional diagram illustrating the sacrificial dielectric having been removed according to an embodiment of the present invention.
Figure 10:
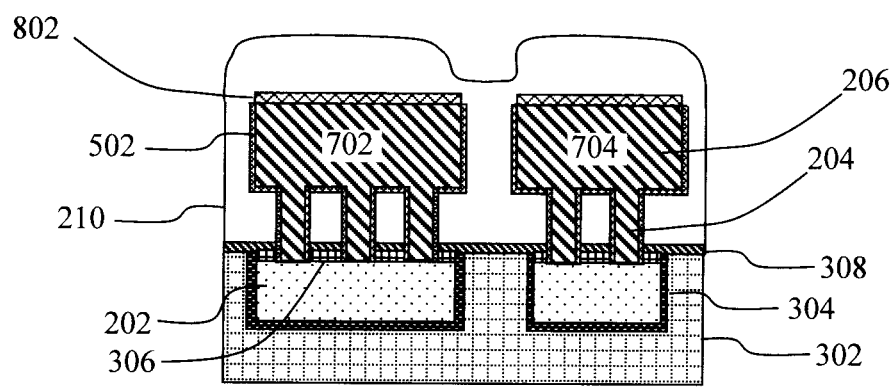
FIG. 10 is a cross-sectional diagram illustrating the sacrificial dielectric having been replaced with an interlayer dielectric according to an embodiment of the present invention.

With selective capping layer 802 in place over the metal lines 206, the sacrificial dielectric 402 can then be removed. See FIG. 9. As shown in FIG. 9, sacrificial dielectric 402 has been removed in its entirety from the structure. As provided above, the use of more robust sacrificial dielectric such as $SiO_2$ and SiN for via and trench patterning and metallization produces a better via profile with little, if any, chamfering. Further, any damage caused by the patterning and metallization is removed along with the sacrificial dielectric 402. By way of example only, sacrificial dielectric 402 can be removed using an oxide or nitride-selective non-direction (i.e., isotropic) etching process such as wet chemical etch with dilute hydrofluoric acid (HF).

Figure 11:
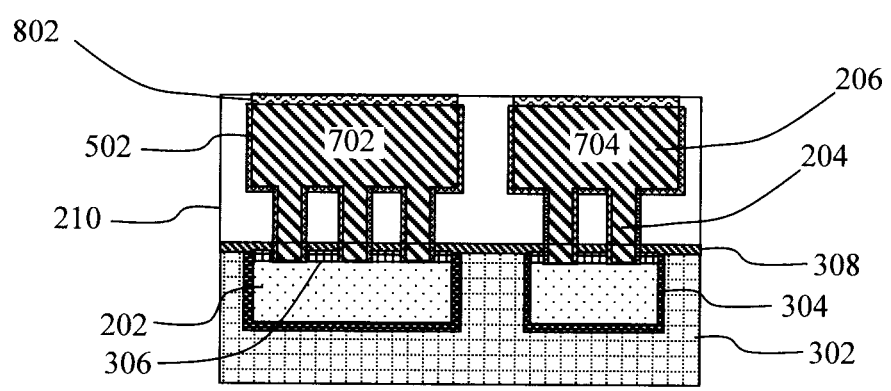
FIG. 11 is a cross-sectional diagram illustrating excess ILD having been removed (e.g., by CMP) according to an embodiment of the present invention.
Figure 12:
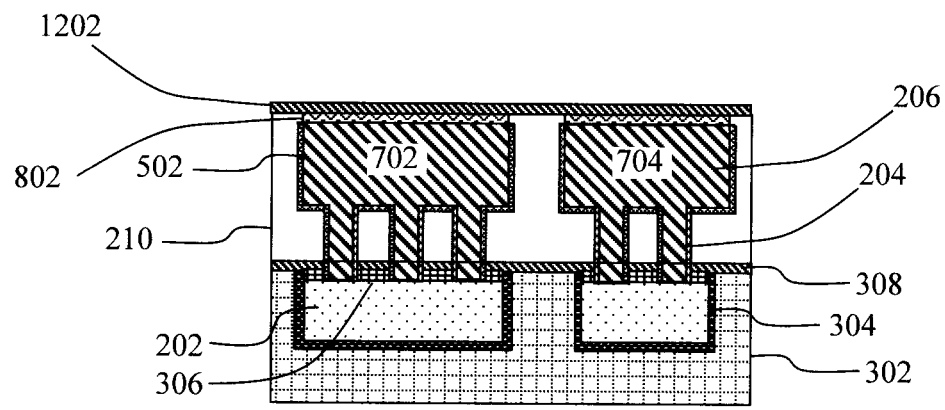
FIG. 12 is a cross-sectional diagram illustrating a blanket capping layer having been formed over the interconnects/selective capping layer and the ILD according to an embodiment of the present invention.
Figure 13:
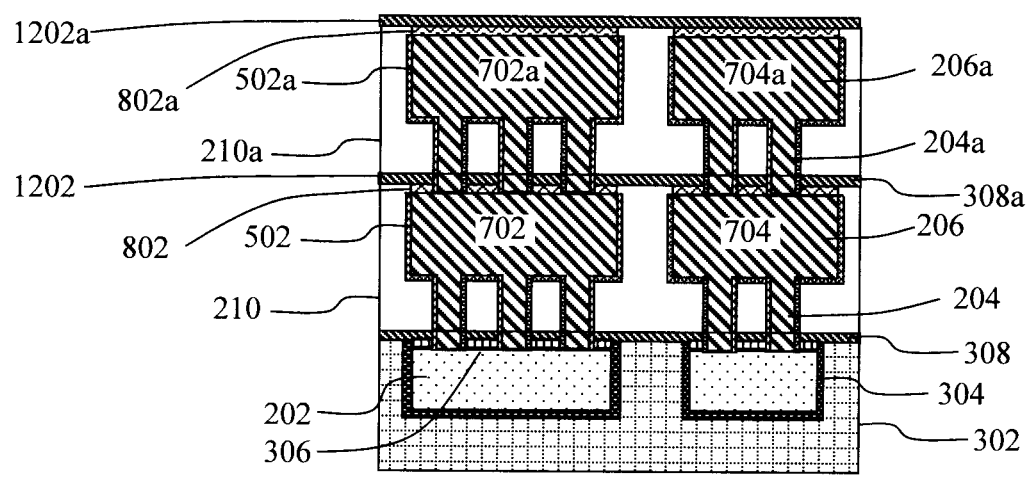
FIG. 13 is a cross-sectional diagram illustrating a second layer of interconnects having been built according to an embodiment of the present invention.
Figure 14:
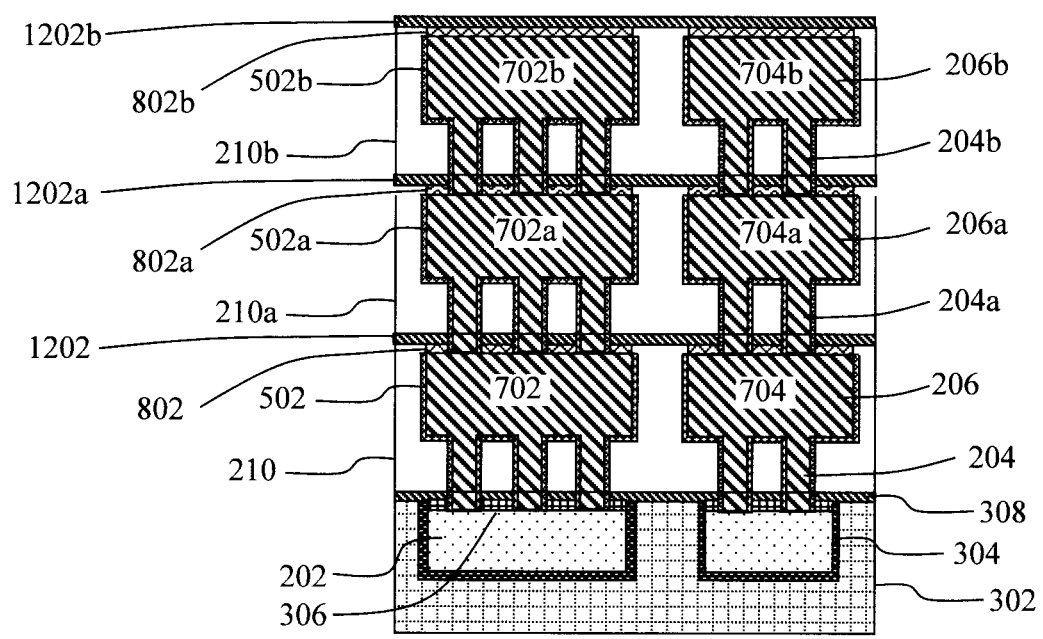
FIG. 14 is a cross-sectional diagram illustrating a third layer of interconnects having been built according to an embodiment of the present invention.

The sacrificial dielectric 402 is then replaced with ILD 210. See FIG. 10. Suitable dielectric materials for ILD 210 include, but are not limited to, SiOx and/or SiCOH and/or ULK-ILD materials such as pSiCOH. According to an exemplary embodiment, ILD 210 is deposited using a flowable CVD process which enables ILD 210 to fill in the gaps. Excess ILD 210 is then removed using a process such as CMP to polish ILD 210 down to the surface of selective capping layer 802. See FIG. 11. As shown in FIG. 11, the result is a flat, planar surface. It is notable that, based on the above-described process, barrier layer 502 separates interconnects 702/704 from ILD 210, however there is no barrier layer 502 present at the bottom of the vias 204 in between the interconnects 702/704 and the metal lines 202.

A blanket capping layer 1202 is then formed over the interconnects 702 and 704/selective capping layer 802 and ILD 210. See FIG. 12. As provided above, suitable materials for blanket capping layer 1202 include, but are not limited to, nitride materials such as SiN, SiCN and/or SiOCN.

The above-described process can then be repeated to form multiple layers of interconnects. For instance, by way of example only, a first iteration of the process is shown illustrated in FIG. 13 to build a second layer of interconnects 702a/704a, and a second iteration of the process is shown illustrated in FIG. 14 to build a third layer of interconnects 702b/704b, and so on. The structures in the second layer are given reference numerals with the designation 'a', those in the third layer are given reference numerals with the designation and so on.

The same process as described in detail above is implemented in forming the second, third, etc. layers of interconnects 702a/704a. Namely, features, i.e., vias and trenches, are patterned in a sacrificial dielectric on top of the interconnects 702/704. A conformal barrier layer 502a,b is then selectively deposited onto the sacrificial dielectric, lining the vias and trenches. A conductor is deposited into and filling the vias and trenches to form conductive vias 204a,b and the metal lines 206a,b, respectively, followed by CMP. Conductive vias 204a,b and the metal lines 206a,b together form interconnects 702a,b and 704a,b. A selective capping layer 802a,b is then (selectively) formed on each of the interconnects 702a,b and 704a,b, and the sacrificial dielectric is removed and replaced with ILD 210a,b. A blanket capping layer 1202a,b is formed over the interconnects 702a,b and 704a,b/selective capping layer 802a,b and ILD 210a,b.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An interconnect structure, comprising:
   a metal line embedded in a dielectric;
   an interlayer dielectric (ILD) disposed over the metal line;
   a first interconnect formed in the ILD on top of the metal line, wherein:
   the first interconnect directly contacts the metal line;
   the first interconnect comprises a plurality of vias; and
   all sidewalls of the plurality of vias are parallel to one another;
   a barrier layer separating the first interconnect from the ILD;
   a selective capping layer disposed on the first interconnect;

a blanket capping layer disposed (i) on the selective capping layer and the ILD and (ii) over the first interconnect and a second interconnect, wherein:
    the selective capping layer and the blanket capping layer are different materials; and
    top surfaces of the selective capping layer and the ILD are coplanar; and
a second plurality of vias passing through the blanket capping layer and the selective capping layer, wherein the second plurality of vias directly contact the first interconnect.

2. The interconnect structure of claim 1, wherein the first interconnect is void-free.

3. The interconnect structure of claim 1, wherein the first interconnect comprises a conductor selected from the group consisting of: cobalt (Co), ruthenium (Ru), rhodium (Rh), and iridium (Ir).

4. The interconnect structure of claim 1, wherein the first interconnect comprises a conductor selected from the group consisting of: Co and Ru.

5. The interconnect structure of claim 1, wherein the selective capping layer is nickel (Ni).

6. The interconnect structure of claim 1, wherein the selective capping layer comprises Ru.

7. The interconnect structure of claim 1, wherein the barrier layer comprises tantalum nitride (TaN).

8. The interconnect structure of claim 1, wherein the barrier layer has a thickness of less than 1 nm.

9. The interconnect structure of claim 1, wherein the ILD comprises porous organosilicate glass (pSiCOH).

10. An interconnect structure, comprising:
a metal line embedded in a dielectric;
an interlayer dielectric (ILD) disposed over the metal line;
a first interconnect formed in the ILD on top of the metal line, wherein:
    the first interconnect comprises cobalt (Co);
    the first interconnect directly contacts the metal line;
    the first interconnect comprises a plurality of vias; and
    all sidewalls of the plurality of vias are parallel to one another;
a barrier layer separating the first interconnect from the ILD;
a selective capping layer disposed on the first interconnect;
a blanket capping layer disposed (i) on the selective capping layer and the ILD and (ii) over the first interconnect and a second interconnect, wherein:
    the selective capping layer and the blanket capping layer are different materials; and
    top surfaces of the selective capping layer and the ILD are coplanar; and
a second plurality of vias passing through the blanket capping layer and the selective capping layer, wherein the second plurality of vias directly contact the first interconnect.

11. The interconnect structure of claim 10, wherein the first interconnect is void-free.

12. The interconnect structure of claim 10, wherein the selective capping layer is nickel (Ni).

13. The interconnect structure of claim 10, wherein the selective capping layer comprises Ru.

14. The interconnect structure of claim 10, wherein the barrier layer comprises tantalum nitride (TaN).

15. The interconnect structure of claim 10, wherein the barrier layer has a thickness of less than 1 nm.

16. The interconnect structure of claim 10, wherein the blanket capping layer comprises a nitride material.

17. The interconnect structure of claim 16, wherein the nitride material is selected from the group consisting of: silicon nitride (SiN), silicon carbonitride (SiCN), and silicon oxycarbonitride (SiOCN).

18. The interconnect structure of claim 10, wherein the ILD comprises porous organosilicate glass (pSiCOH).

* * * * *